(12) United States Patent
Colton et al.

(10) Patent No.: US 6,507,984 B2
(45) Date of Patent: Jan. 21, 2003

(54) DETAILING TOOL FOR SUBSTRATES HAVING A SELF-ALIGNMENT FEATURE

(75) Inventors: Glenn S. Colton, Wappingers Falls, NY (US); Francis R. Krug, Jr., Highland, NY (US); John R. Lankard, Jr., Poughkeepsie, NY (US); Robert Weiss, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 09/873,141

(22) Filed: Jun. 1, 2001

(65) Prior Publication Data

US 2002/0182025 A1 Dec. 5, 2002

(51) Int. Cl.[7] .............................. B23Q 5/22; B23D 1/08
(52) U.S. Cl. ...................... 29/33 A; 29/33 P; 264/67; 409/297; 409/303
(58) Field of Search ............................. 409/303, 297, 409/301, 295, 159, 168, 138; 83/929.1, 914; 29/33 A, 563, 33 P; 451/28, 274; 264/67

(56) References Cited

U.S. PATENT DOCUMENTS

| 5,567,366 A | * | 10/1996 | Motegi et al. ................. 264/39 |
| 5,706,568 A | | 1/1998 | Nenadic et al. |
| 5,871,313 A | * | 2/1999 | Nenadic et al. ............. 409/138 |
| 6,033,289 A | * | 3/2000 | Cellier et al. .................. 451/28 |
| 6,232,551 B1 | * | 5/2001 | Chang ........................ 174/52.4 |
| 6,281,044 B1 | * | 8/2001 | VanNortwick ............... 438/108 |

FOREIGN PATENT DOCUMENTS

| JP | 61-188035 | * | 8/1986 | ................. 29/33 A |
| JP | 63-7217 | * | 1/1988 | ................. 29/33 A |

* cited by examiner

*Primary Examiner*—William Briggs
(74) *Attorney, Agent, or Firm*—McGinn & Gibb, PLLC; Ira D. Blecker, Esq.

(57) ABSTRACT

A detailing tool for processing electronic component substrate includes a supporting frame, a substrate carrier movable on the supporting frame to receive and secure the substrate during processing by the tool, and a pair of cutter assembly attached to said supporting frame for removing tails on said substrate. The cutter assemblies self-align "to" the substrate during initial substrate loading in a processing area of the tool. Each cutter assembly includes a pair of spaced, translatable and opposed cutters that simultaneously move towards each another while removing the tails from the corners of the substrate that remains stationary. The pair of cutter assemblies are symmetrically attached to the supporting frame with respect to an axis for indexing the substrate. Thus, the invention provides a tool for cutting tails from opposite corners on the substrate edge automatically and simultaneously during processing.

19 Claims, 3 Drawing Sheets

DETAILING TOOL FOR SUBSTRATES HAVING A SELF-ALIGNMENT FEATURE

BACKGROUND OF THE INVENTION

1. Field of the Invention

The present invention generally relates to semiconductor substrate machining tools and methods, and more particularly to a detailing tool for such applications that is used prior to firing green substrate that is used in semiconductor products.

2. Description of the Related Art

There has been a long felt need to provide a high-volume, low-cost, high-speed method for preparing unfired substrates of the type which are used in electronic applications, for example, to produce multi-layer ceramic (MLC) structures typically used to make single chip modules (SCM) or multi-chip modules (MCM). These substrates may be made from ceramic or composite ceramic/polymer materials. Such substrates are generally planar and square or rectangular in top plan view, with a thickness substantially less than the length and width dimensions. The edges are initially produced with approximately vertical, square edges as seen in side elevational view, which is the design being processed by the invention.

Conventional processes for producing MLC substrate include the steps of casting a ceramic slip to form a green, dried ceramic film of 0.001" to 0.002" thickness. These carrier substrate are formed of a ceramic base which is fabricated from a green ceramic of a suitable type such as alumina or beryllia suitably milled in small amounts of suitable lubricants and temporary binders as are well known in the ceramic arts. Initially, printing of a registered matrix of metal pigmented inks to form the electrodes and related structures are performed to form the finished MLC on the ceramic film. Next, lamination of the stack of printed ceramic sheets is performed with pressure and heat to form a compacted structure. Finally, cutting of the compacted structure by a cutter device is performed to form "chicklets" that form the substrate.

Conventional processing of these green ceramic substrate prior to firing requires removal of burrs (i.e., tails) from substrate corners. This processing step is crucial since any extraneous burrs remaining on the substrate cause damage to the MLC when fired. Such measures are now done by hand and require careful scrutiny of what is being done. Then, thermal processing, consisting of a drying and bake out cycle, is performed to eliminate the organic components from the green parts, followed by a firing cycle to 2,000 to 2,300 degrees Fahrenheit to form the final ceramic substrate.

It would be desirable to have a tool that is able to clean and remove the tails from green substrate corners effectively and efficiently. Further, soft ceramic/polymer composites as used for IC substrates, are vulnerable to edge delamination in multilayer ceramic packages, by embedded ceramic debris, self-contamination, surface metallurgy damage, and scratching. Therefore, it is desirable not only to protect the substrate from damage during this processing of tail removal, but also to clean any tails while performing this process, thereby obviating substrate contamination.

The present invention solves such problems resulting in an efficient method using a detailing tool as described in the following description and accompanying drawings.

SUMMARY OF THE INVENTION

The invention provides a mechanized method and a detailing tool for removal of tails from corners of a green substrate prior to firing. The detailing tool aligns "to" the green substrate prior to removal of the tails within an aligning member. The invention can preferably be used in combination with a rotary table that provides proper indexing of the substrate. Initially, the multiple substrates are placed into a processing holder member of the detailing tool on a rotary table. The substrate is placed on this holder typically by a vacuum attaching force through a void on the underside of the table. The detailing tool initially aligns itself to the substrate on the holder with an air bearing that uses an edge of the substrate as a reference plane. The cutter head assemblies (although one cutter head assembly can be used) that are attached to a slide table member of the detailing tool are then closed (Y-direction). Next, each of the cutter head assemblies close inward in opposite directions (X-direction) at the corners so as remove the tails from the substrate. During this process, any tail debris is siphoned off by a vacuum cleaning action so that no contamination occurs. Next, the cutter head assemblies open and the slide table member moves back to the initial pre-load configuration. Thereafter, the rotary table is indexed by 90 degrees to repeat this process on the other side of the substrate.

Processed substrates are automatically deposited into an output tray every several seconds with the tails from the corners removed and are preferably drawn off by vacuum equipment to free areas of tail debris. The detailing tool is fully automatic and can operate in a multiple station tool to process multiple substrates simultaneously at complimentary stations that cooperatively and progressive index substrates for efficient and cost-effective removal of tails on semiconductor products.

Therefore, one object of the invention is to provide a detailing tool for processing electronic component substrates that include a supporting frame, a substrate carrier movable on the supporting frame to receive and secure the substrate during processing by the tool, and a pair of cutter assemblies attached to the supporting frame for removing tailings on the substrate. Each cutter assembly includes a pair of spaced, translatable and opposed cutters that simultaneously move toward each other while removing the tails from the corners of the substrate (that remains stationary). The pair of cutter assemblies is symmetrically attached to the supporting frame with respect to an axis for indexing the substrate. Thus, the invention can cut opposite edges of the substrate automatically and simultaneously during processing.

BRIEF DESCRIPTION OF THE DRAWINGS

The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which.

DETAILED DESCRIPTION OF PREFERRED EMBODIMENTS OF THE INVENTION

The invention provides an automatic detailing machine which removes the tails (i.e., unwanted ceramic material on edges of semiconductor chips) from ceramic substrates. In semiconductor processing, a matrix on a large area carrier is initially sectioned or "diced" (by sawing) into a plurality of separate sections or "chicklets" (substrates). These chicklets are then loaded into trays and processed by the detailing tool of the invention.

Figure 1:
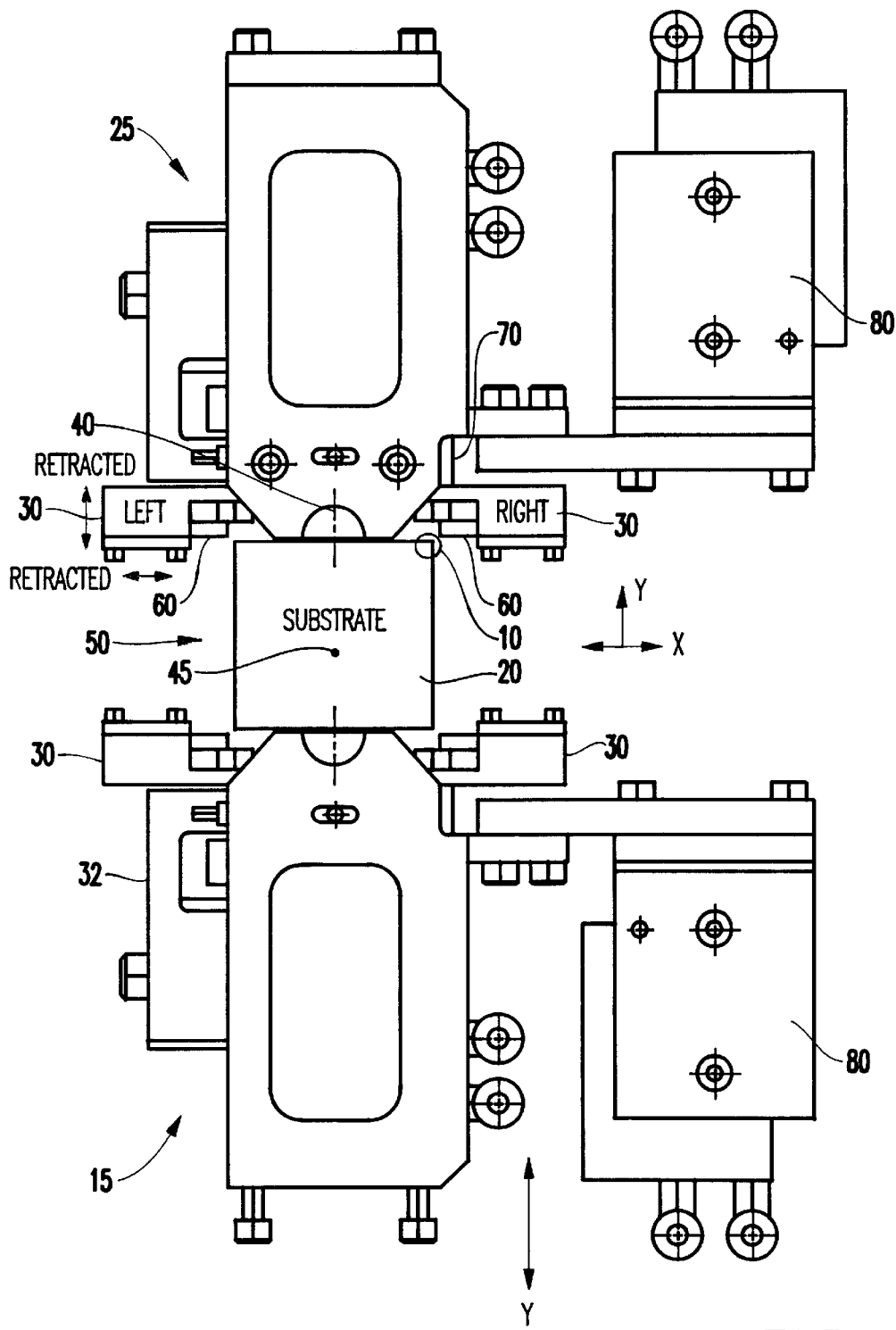
FIG. 1 shows a top view of the detailing tool in accordance with the invention.
Figure 2:
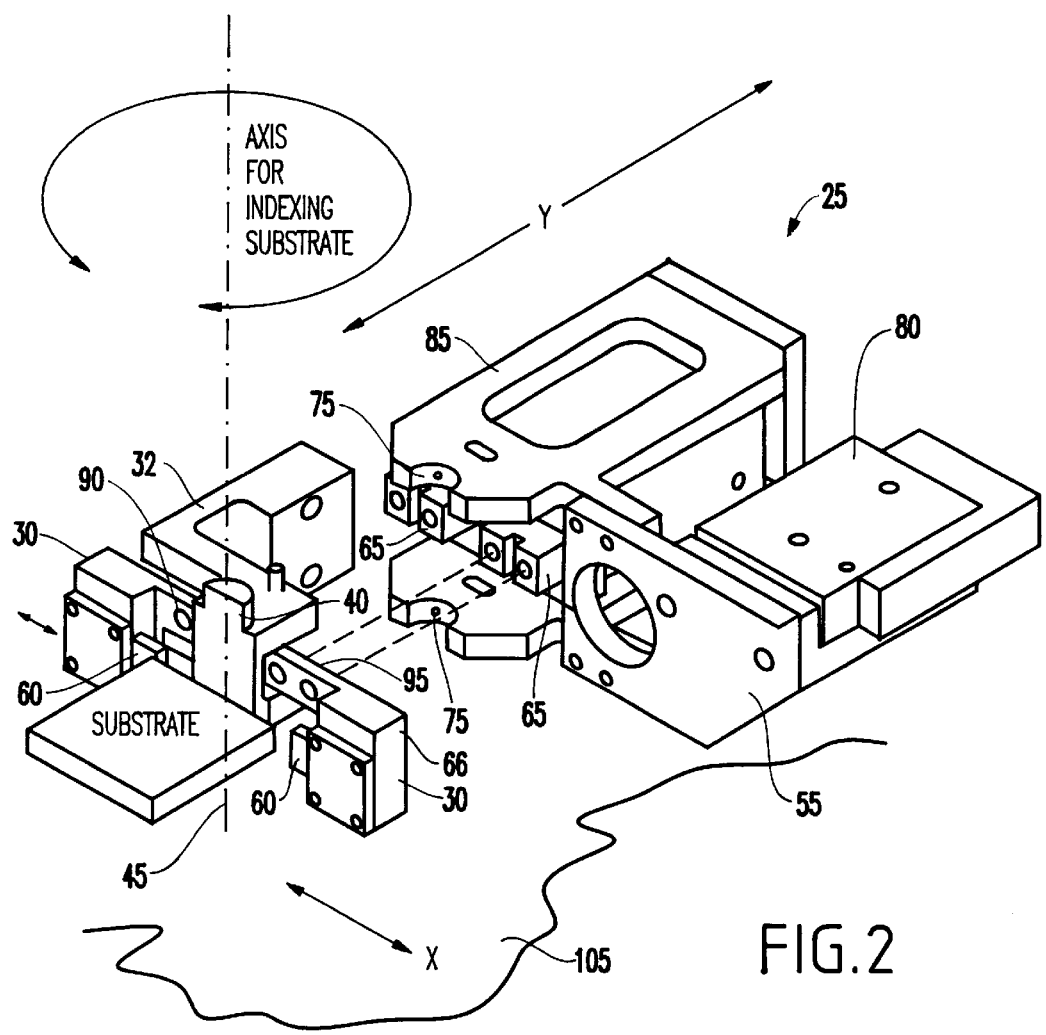
FIG. 2 shows an enlarged isometric view of one of the cutter assemblies with the cutter heads separated from the supporting frame of the tool.
Figure 3:
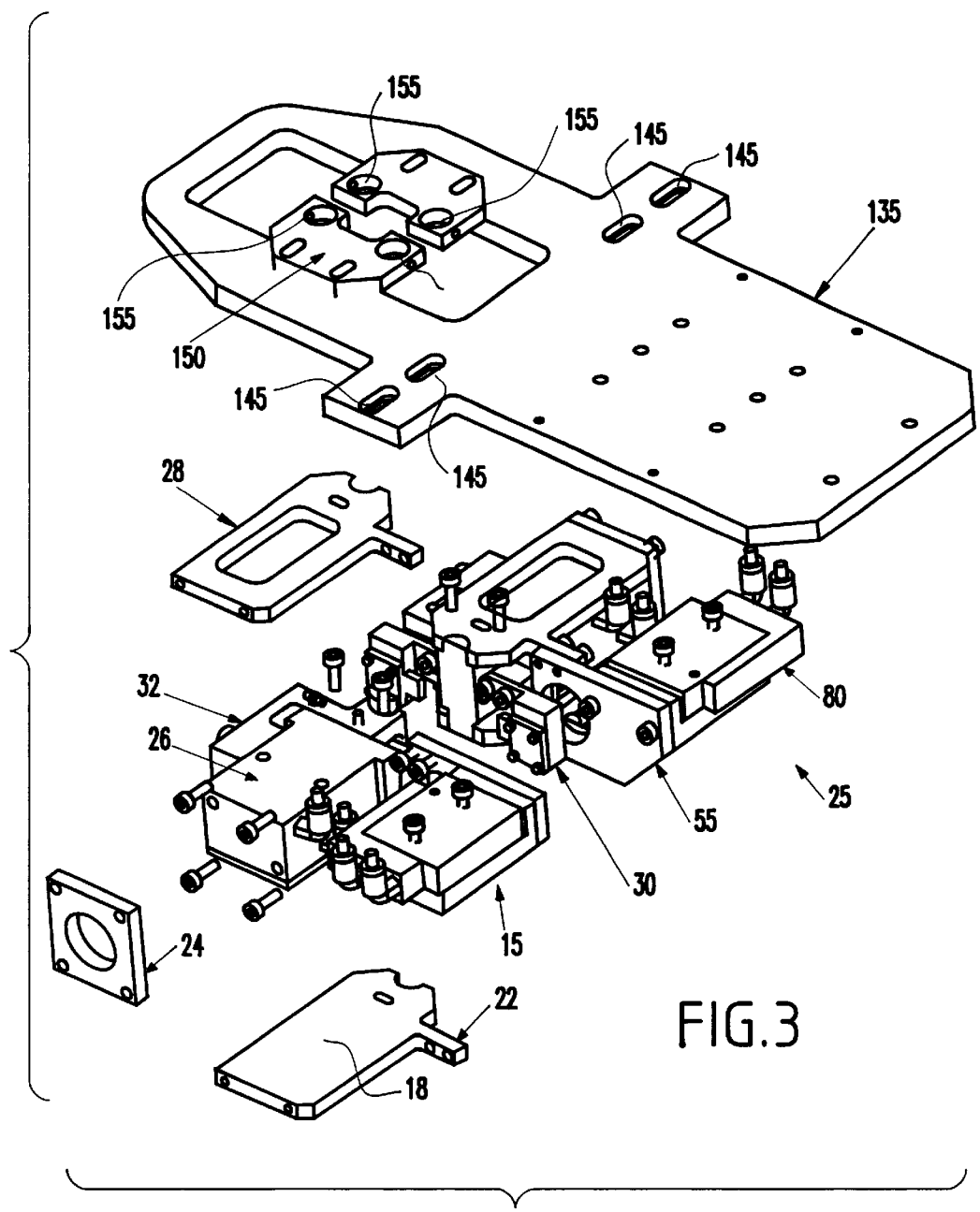
FIG. 3 shows an exploded isometric view of the invention.

The preferred embodiments of the present invention and its advantages are best understood by referring to FIGS. 1–3 of the drawings, wherein like numerals are used for like and corresponding parts of the various drawings. The invention is a detailing tool that preferably is used in combination with a rotary table for proper indexing of the substrate. Initially, the multiple substrates are placed into a processing placement holder attached to a translational driver of a rotary table to be loaded to the location of the detailing tool where processing occurs. When the corner of the substrate has been processed along one edge, the indexable rotary table is operated to rotate the substrate through 90 degrees. The substrate is then moved between the two cutter assemblies a second time, which removes the tails at all four substrate corners.

After being processed by the invention, the substrate can be automatically deposited into an output tray every several seconds with the tails removed. Vacuum equipment is used to ensure no tail debris remains on the substrate. The detailing tool is fully automatic and can operate as one of multiple station tools that process multiple substrates simultaneously. Such a machine can cooperatively and progressively index substrates for efficient and cost-effective removal of tails on MLC semiconductor products.

Referring now to FIG. 1, a top view of a preferred form of a detailing tool 100 is shown. The preferred form of the tool 100 has two opposing and similar tool subassemblies 15 and 25 that perform comparable mirrored operations of removing unwanted ceramic material from the corners 10 of the substrate 20. These substrate ("chicklets") are sized by a previous dicing operation. The tool is preferably operated by removing tails from two opposing sides of the substrate simultaneously. The substrate 20 initially can be loaded either manually in the processing area 50, or by an automated loading mechanism (not shown for clarity) as taught in commonly owned U.S. Pat. No. 5,706,568, which is hereby incorporated by reference. This reference shows a known method wherein substrates are subjected to a more complex chamfering cutting using an automated loading device for efficient and cost effective manufacturing of substrate. Each of the cutter assemblies 30 are initially retracted while the substrate 20 is loaded.

Each of the cutter assemblies 30 not only move inwards and outwards from an edge surface of the substrate 20 (Y-direction), but also can pivot on a pivotal arm member 40 that rides on air-type bearings. The center of rotation is on the edge of the substrate 20. The arm 40 bears against a pivotal bracket 32 that attaches to gripper housing 26 (FIG. 3). This pivoting capability provides adaptive alignment since the substrate can be slightly misaligned during initial positioning. Moreover, this feature is optional and a rigid attached member can be used if proper control is provided during initial placement of the substrate.

When the substrate is positioned, each of the cutter assemblies 30 are driven inwards by an air cylinder 70 actuator against the edges of the substrate 20. This action self-aligns the tool to the substrate 20. Each of the cutter assemblies 30 float on air bearings, making uniform contact with the edges of the substrate, which in turn provides for automatic proper alignment of the substrate with the cutter assemblies 30. Next, the left and right side of each cutter assembly 30 are driven toward each other (as indicated by the reciprocating arrows) while the cutter bits 60 remove the tails from the corners of the substrate. After the tails are removed. the cutter bits 60 are retracted from the substrate 20. The substrate can then be indexed using a rotary table so other substrate sides can be similarly processed.

FIG. 2 shows an enlarged view of one side of the tool as subassembly 25 wherein the cutter assemblies 30 are shown with the cutter tool bits 60. The cutter bits 60 can be square-faced bits made of carbide. The preferred design of each of the cutter assembly 30 is left side 90 and right side 95, each of which is attached to the pivotal arm member 40 that rides on a pair of air bearings 75 (that are plates 18 and 28) as shown in FIG. 3. This in turn is attached to gripper member housing 85 of the tool. The pivotal arm member 40 pivots to allow initial self-aligned positioning of the substrate 20 when inserted into work area 50.

The invention can be implemented by using only one of the cutter head assemblies 30, so long as the substrate being processed is securely fastened to a fixing plate or equivalent chuck device of a mounting table. The substrates 20 as used in the tool are preferably products that have a rectangular shape or square shape. Alternatively, the shape of the product can be other forms, so long as one edge is required to be detailed by using the tool.

The main gripper member housing 85 is attached to a supporting base structure through a connection plate 55 to a support member 80. The components within the gripper member housing 85 include linear actuators. Linear actuator 70 as shown in FIG. 1 drives the tool 100 in the Y-direction during initial alignment of the substrate with respect to the pivotal arm member 40 that rides on air bearings 75. Another linear actuator is mounted transversely in the gripper housing and controls movement of the cutter assemblies 30 through members 65. The linear activators have pintals or floating screws that interface with voids within the arms 66 of the cutter assemblies 30 so as to allow free motion without binding during movement. The linear actuators (used for both functions of Y-translation and cutting in the X-direction) are preferably pneumatically operated at a pressure of around 60 psi. This form of actuator allows for flexible alignment of the substrate during loading and obviates potential problems encountered when a mechanical linkage with gear driven members is used.

The base structure to which the invention attaches is typically another mechanism that operates independently of the invention. Such a mounted structure can be a rotary table 105, which has at least a translational element which can move in one translational direction (X-direction as shown in FIG. 2). This can also have a Y-directional translational element if the combined apparatus is so required. The drivers for moving these translational elements are well known in the art and are not described so as not to obscure the salient features of the invention. The rotary table 105 is indexable such that the substrate can be rotated to allow the processing of a second side of the substrate without removal. A vacuum fixing plate is typically part of the rotary table 105 and holds the substrate in place. Use of a vacuum mounting fixing plate allows the substrate to be properly aligned by the air bearings 40 that rotate in recesses 75 and corrects for misalignments during substrate loading. The indexable rotary table 105 is fixed in position by a locating mechanism forming part of the indexing table to maintain substrate positioning.

In FIG. 3, an exploded perspective view of both tool subassemblies 15 and 25 of the tool are shown with a mounting plate 135. The mounting plate allows for modifying the positioning of the cutter assemblies with main gripper member housing 85 of the tool to accommodate a wide range of substrate sizes by use of adjustable holes 145 therein. A vacuum plate 150 attaches to the plate 135 and has several vacuum holes 155 that provide openings for vacuuming tails (once removed from the corners of the substrate) to avoid contamination.

The tool subassembly 15 is exploded further to show component parts that hold this subassembly together and function properly. The subassembly 15 includes an air bearing support base plate 22 having an air inlet hole 18 that allows the gripper housing 26 to pivot. The base plate 22 in turn attaches to mounting plate 24 and indirectly connects through pivot plate 28. This construction allows translational movement (Y-direction) and rotational movement on the pivotal arms 40 (that ride on air bearings and rest against the bearings 75 that are attached to the gripper housing 26) when the substrate is loaded.

Variations to the invention include automating operations of the detailing tool by using computerized numerical control methods. This would include operations of processing variable sized and shaped substrate that can be done automatically instead of having to reposition the cutter assemblies 30 in relation to the placement voids 145 in the support plate 135. Moreover, although pneumatic operated actuators are used for driving the cutter assemblies 30 in both the X- and Y-directions as indicated, alternative types of actuators that can be used include stepper motors, hydraulic actuators, and linear motors.

While the invention has been described in terms of preferred embodiments, those skilled in the art will recognize that the invention can be practiced with modification within the spirit and scope of the appended claims.

What is claimed is:

1. A detailing tool for processing an electronic component substrate, said tool comprising:
    a supporting frame;
    a substrate carrier positioned on said supporting frame and being movable on said supporting frame to receive and secure said substrate during processing by said tool; and
    at least one cutter assembly pivotally attached to said supporting frame for removing tails on said substrate, wherein said cutter assembly includes a pair of opposed cutters that move towards each other to remove said tails from said substrate.

2. The tool of claim 1, wherein said substrate carrier includes a rotary table for rotating said substrate about an axis normal to the plane of said substrate.

3. The tool of claim 2, wherein said cutter assembly comprises two assemblies, said assemblies are symmetrically attached to said frame with respect to an axis for indexing said substrate, whereby opposite edges of said substrate are simultaneously cut during processing.

4. The tool of claim 1, wherein said cutter assembly includes a pivot member connected to support frame wherein said cutter assembly pivots about said pivot member with respect to said supporting frame to engaged said substrate and align said substrate with said cutters.

5. The tool of claim 4, wherein said cutter assembly is adjustable to enable cutting of different-sized substrates.

6. The tool of claim 4, wherein said tool includes at least one actuator for driving said cutter assembly toward said substrate that, in combination with said pivot member, provides self-alignment of said cutters and said substrate.

7. The tool of claim 1, further including vacuum ports in said supporting frame for cleaning said substrate during processing, wherein said vacuum ports are configurably attached to an evacuating source.

8. A detailing tool for processing an electronic component substrate, said tool comprising:
    a supporting frame;
    a substrate positioned on said supporting frame and being movable on said supporting frame to receive and secure said substrate during processing by said tool; and
    a pair of cutter assemblies pivotally attached to said supporting frame for removing tails on said substrate, wherein each of said cutter assemblies includes a pair of opposed cutters that move towards each other to remove said tails from said substrate, said pair of cutter assemblies are symmetrically attached to said supporting frame with respect to an axis for indexing said substrate, whereby opposite corners on an edge of said substrate are simultaneously cut during processing.

9. The tool of claim 8, wherein said substrate carrier includes a rotary table for rotating said substrate about an axis normal to the plane of said substrate.

10. The tool of claim 8, wherein said cutter assembly includes a pivot member, said pivot member connected to said support frame, wherein said cutter assembly pivots about said pivot member with respect to said supporting frame to engage said substrate and align said substrate with said cutters.

11. The tool of claim 8, wherein said cutter assembly is adjustable to enable cutting of different-sized substrate.

12. The tool of claim 10, wherein said assembly includes at least one actuator for driving said cutter assembly and said cutter, whereby said actuator for driving said assembly toward said substrate that, in combination with said pivot member, provides self-alignment of said cutter and said substrate.

13. The tool of claim 8, further including vacuum ports in said supporting frame for cleaning said substrate during processing, wherein said vacuum ports are configurably attached to an evacuating source.

14. A detailing tool for processing an electronic component substrate, said tool comprising:
    a supporting frame;
    a substrate carrier positioned on said supporting frame and being movable on said supporting frame to receive and secure said substrate during processing by said tool; and
    at least one cutter assembly pivotally attached to said supporting frame for removing tails on said substrate, wherein said cutter assembly includes a pair of opposed cutters that move towards each other to remove said tails from said substrate;
    wherein said cutter assembly includes a pivot member connected to said support frame wherein said cutter assembly pivots about said pivot member with respect to said supporting frame to engaged said substrate and align said substrate with said cutters.

15. The tool of claim 14, wherein said substrate carrier includes a rotary table for rotating said substrate about an axis normal to the plane of said substrate.

16. The tool of claim 14, wherein said cutter assembly comprise two assemblies, said assemblies are symmetrically attached to said frame with respect to an axis for indexing said substrate, whereby opposite edges of said substrate are simultaneously cut during processing.

17. The tool of claim 14, wherein said cutter assembly is adjustable to enable cutting of different-sized substrates.

18. The tool of claim 14, wherein said tools includes at least one actuator for driving said cutter assembly toward said substrate that, in combination with said pivot member, provides self-alignment of said cutters and said substrate.

19. The tool of claim 14, further including vacuum ports in said supporting frame for cleaning said substrate during processing, wherein said vacuum ports are configurably attached to an evacuating source.

* * * * *